United States Patent [19]
Paul et al.

[11] 4,253,160
[45] Feb. 24, 1981

[54] NONDESTRUCTIVE READOUT, RANDOM ACCESS CROSS-TIE WALL MEMORY SYSTEM

[75] Inventors: Maynard C. Paul; Stanley J. Lins, both of Bloomington; David S. Lo, Burnsville, all of Minn.

[73] Assignee: Sperry Corporation, New York, N.Y.

[21] Appl. No.: 72,968

[22] Filed: Sep. 6, 1979

[51] Int. Cl.³ .............................................. G11C 19/08
[52] U.S. Cl. ...................................... 365/87; 365/172
[58] Field of Search .......................... 365/87, 171, 172

[56] References Cited

U.S. PATENT DOCUMENTS

| | | | |
|---|---|---|---|
| 4,075,612 | 2/1978 | Johnson et al. | 365/87 |
| 4,199,819 | 4/1980 | Schwee et al. | 365/87 |

OTHER PUBLICATIONS

Journal of Applied Physics-49(3), Mar. 1978, pp. 1831-1833.

Primary Examiner—James W. Moffitt

Attorney, Agent, or Firm—Kenneth T. Grace; William E. Cleaver; Marshall M. Truex

[57] ABSTRACT

Disclosed is a cross-tie wall memory system for the generating, propagating and detecting of binary data represented by the presence or absence of cross-tie, Bloch-line pairs along a cross-tie wall in a thin magnetic layer. The system includes a three-level structure comprised of the following superposed layers: a straight-edged current conductive stripline; a serrated-edged thin magnetic layer data track, and a wide-narrow-edged current conductive stripline terminated on one end by a cross-tie, Bloch-line pair generator. A cross-tie detector is positioned intermediate the ends of the data track and is sandwiched between the data track and the wide-narrow-edged current conductive stripline. An N-bit data word is stored in the data track between the generator and the detector, is shifted through the detector for readout of the stored data word and is then restored into its original stored position by being shifted in a reverse manner along the data track and back through the detector.

4 Claims, 27 Drawing Figures

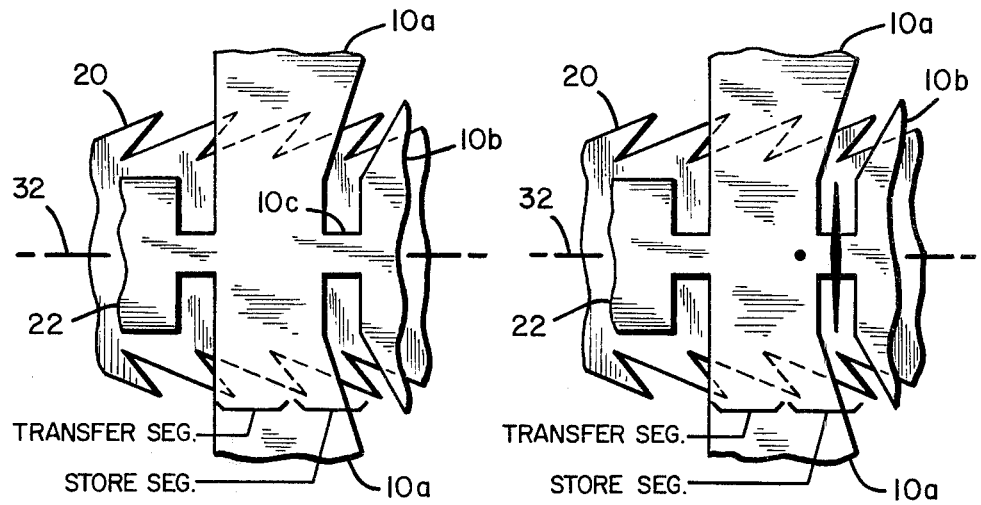
*Fig. 6a*     *Fig. 6b*
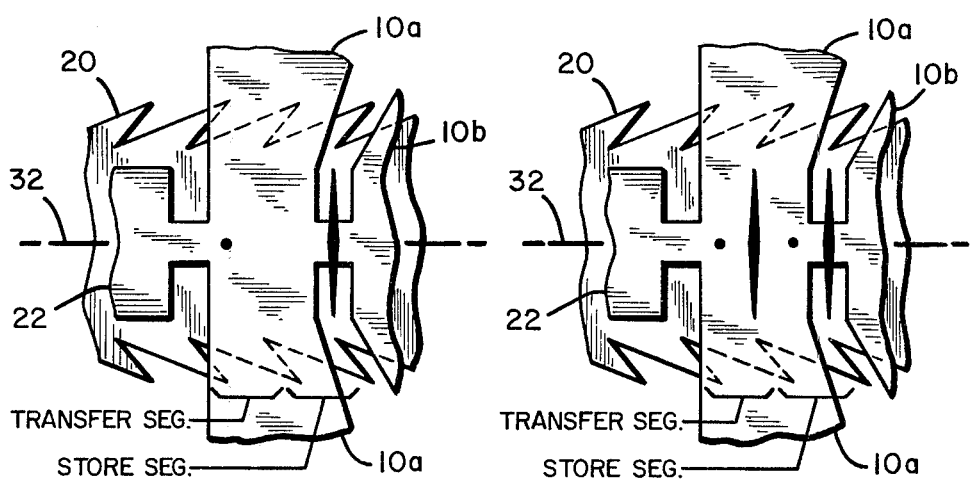
*Fig. 6c*     *Fig. 6d*

| FUNCTION | GENERATOR | LINES | CURRENT SIGNAL |
|---|---|---|---|
| GENERATE | 48 | 10a, 10b | 100 ns , 15 ma |
| WIDE PUSH | 60 | 18<br>22 | 10 μs , 60 ma<br>10 μs , 19 ma |
| WIDE NUCLEATE | 61 | 18 | 50 ns , 105 ma |
| NARROW ANNIHILATE | 62 | 18<br>22 | 25 μs , 62 ma<br>25 μs , 46 ma |
| NARROW PUSH | 63 | 18<br>22 | 15 μs , 26 ma<br>15 μs , 13 ma |
| NARROW NUCLEATE | 64 | 18 | 50 ns , 105 ma |
| WIDE ANNIHILATE | 65 | 18<br>22 | 25 μs , 110 ma<br>25 μs , 21 ma |

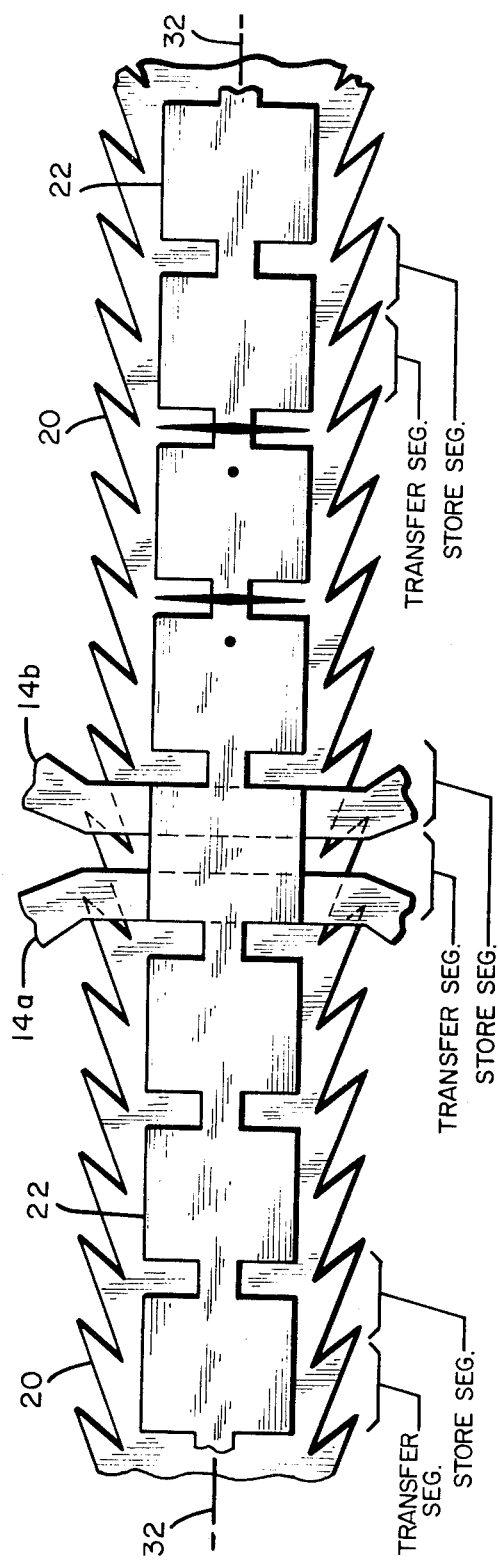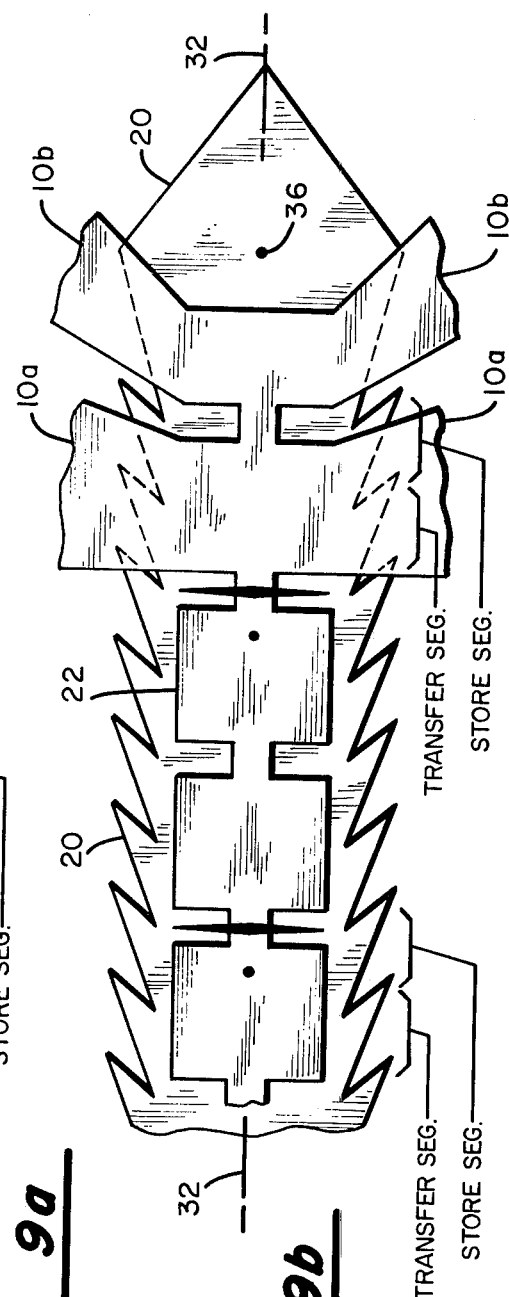
Fig. 9a
Fig. 9b

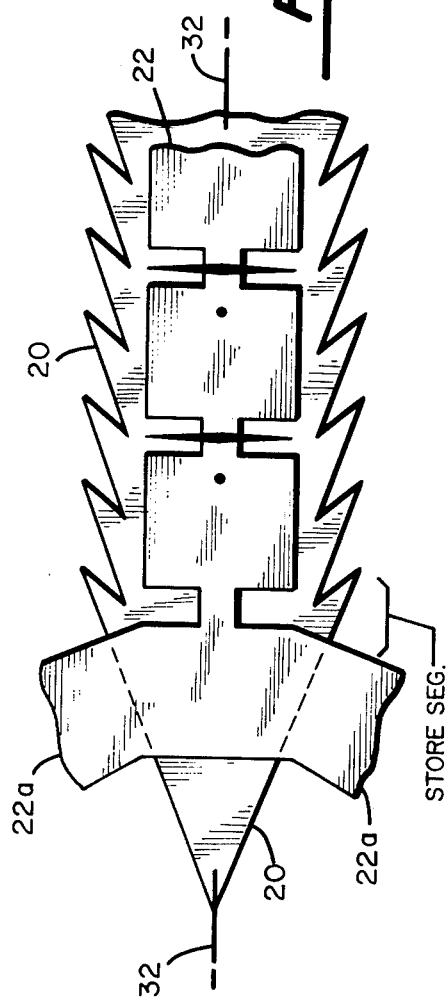
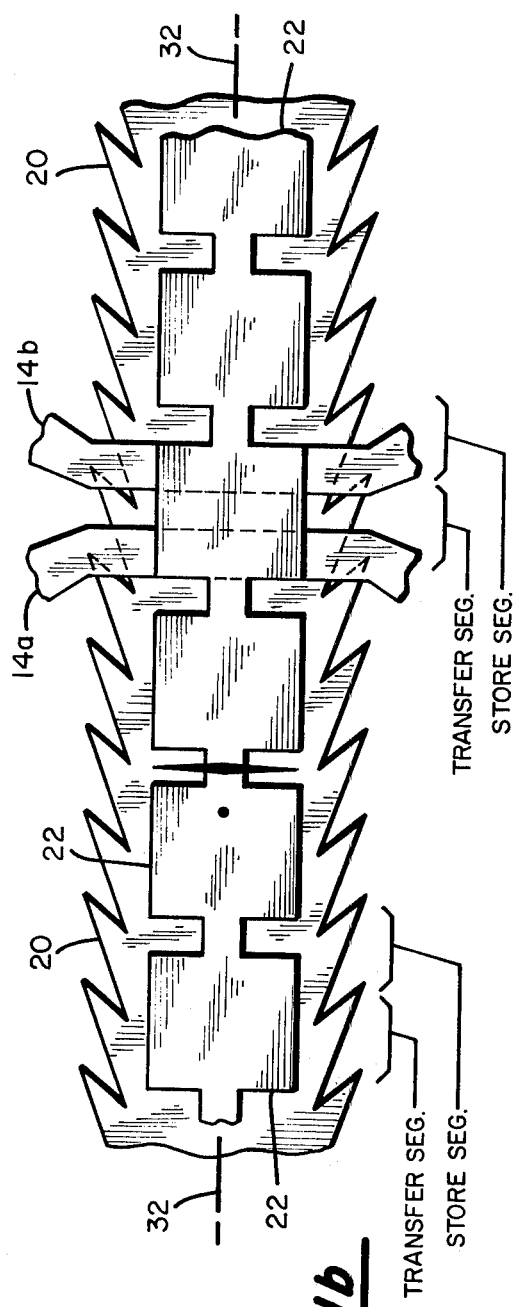

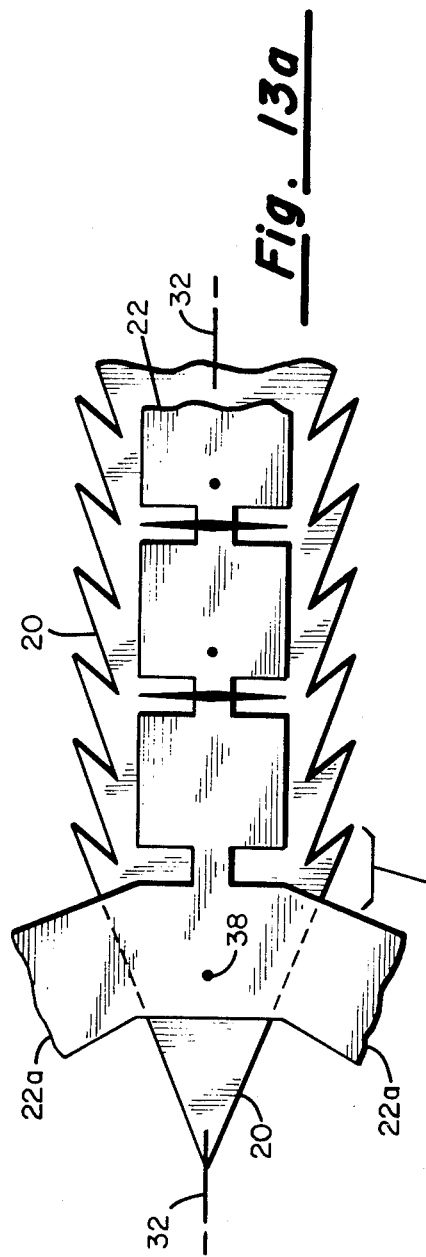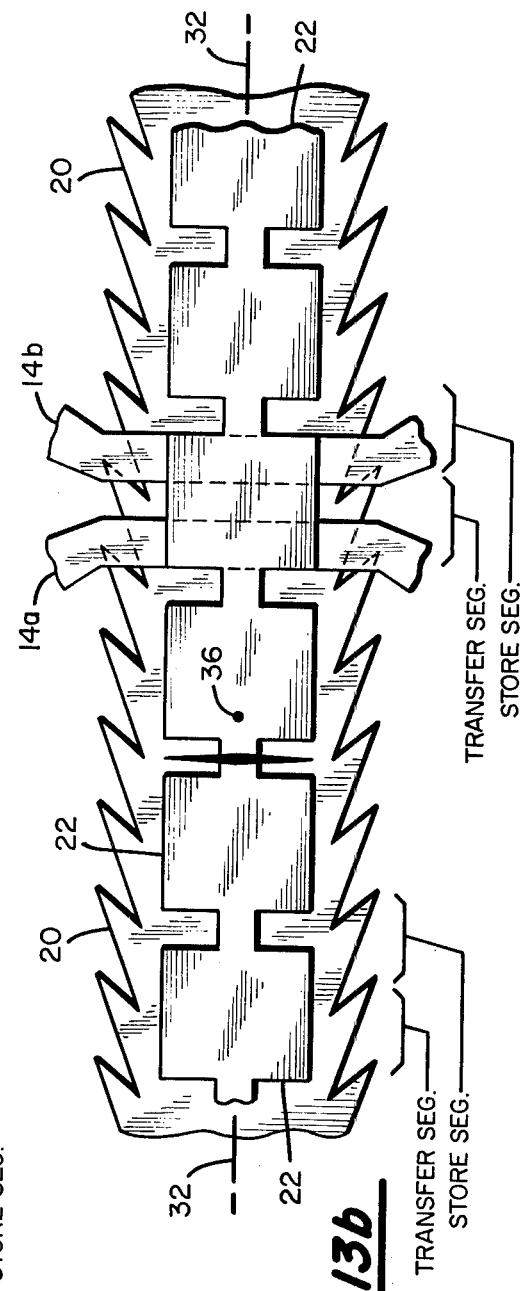
Fig. 13a
Fig. 13b

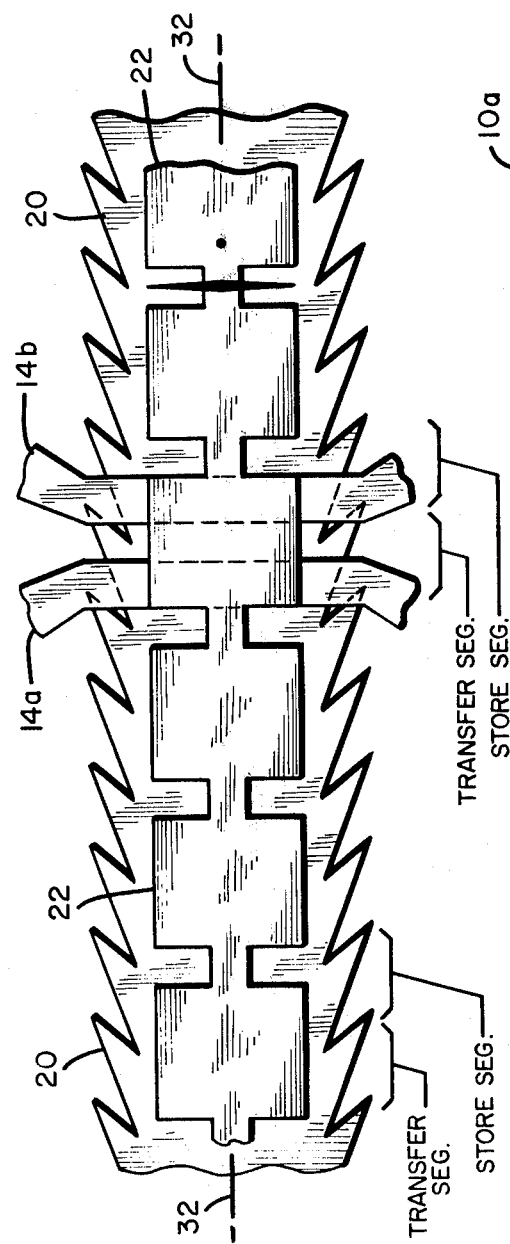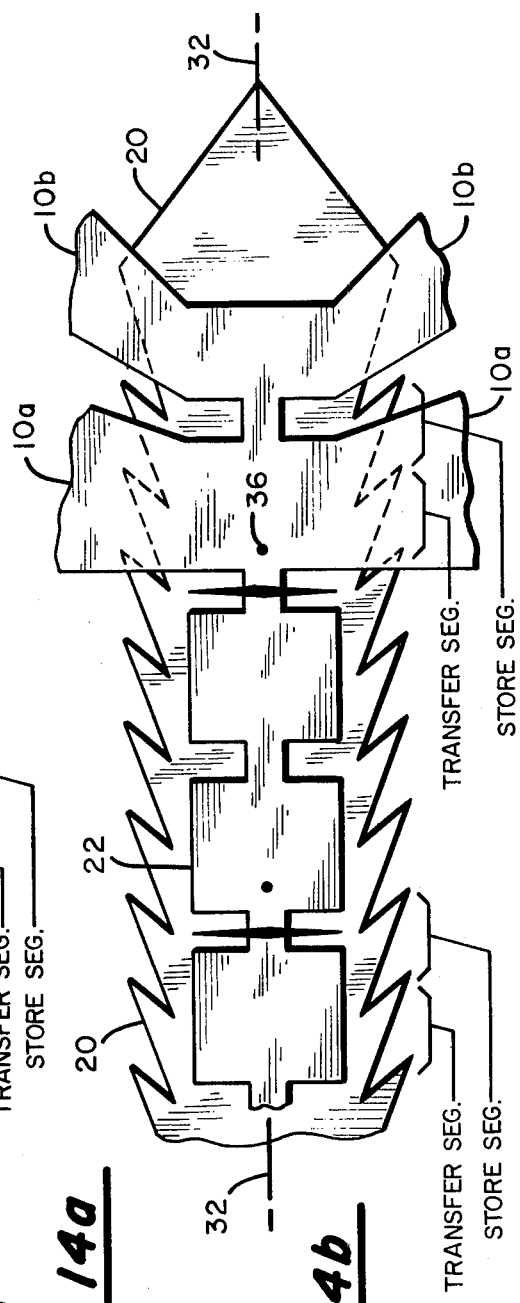

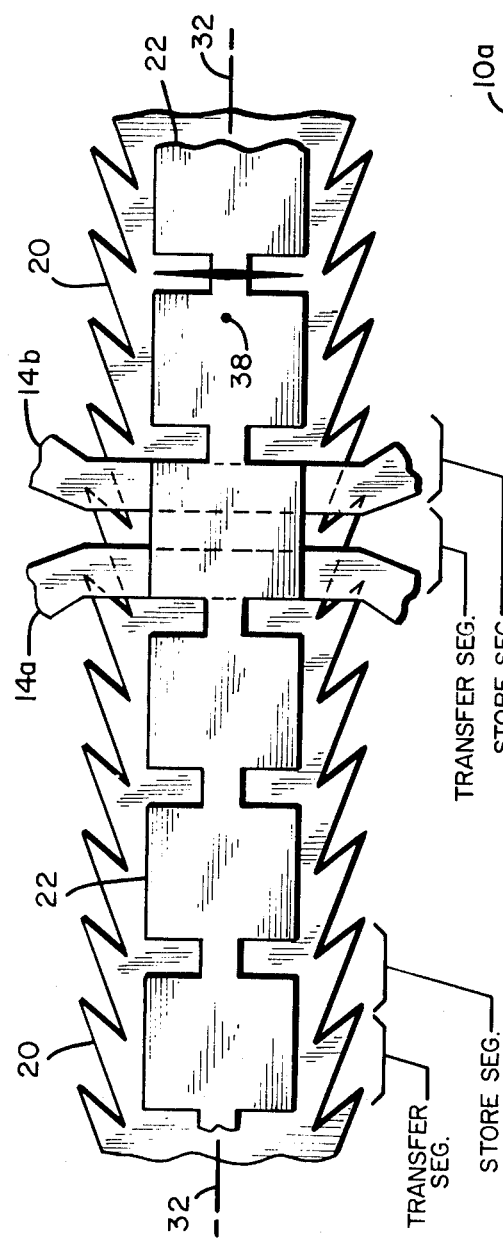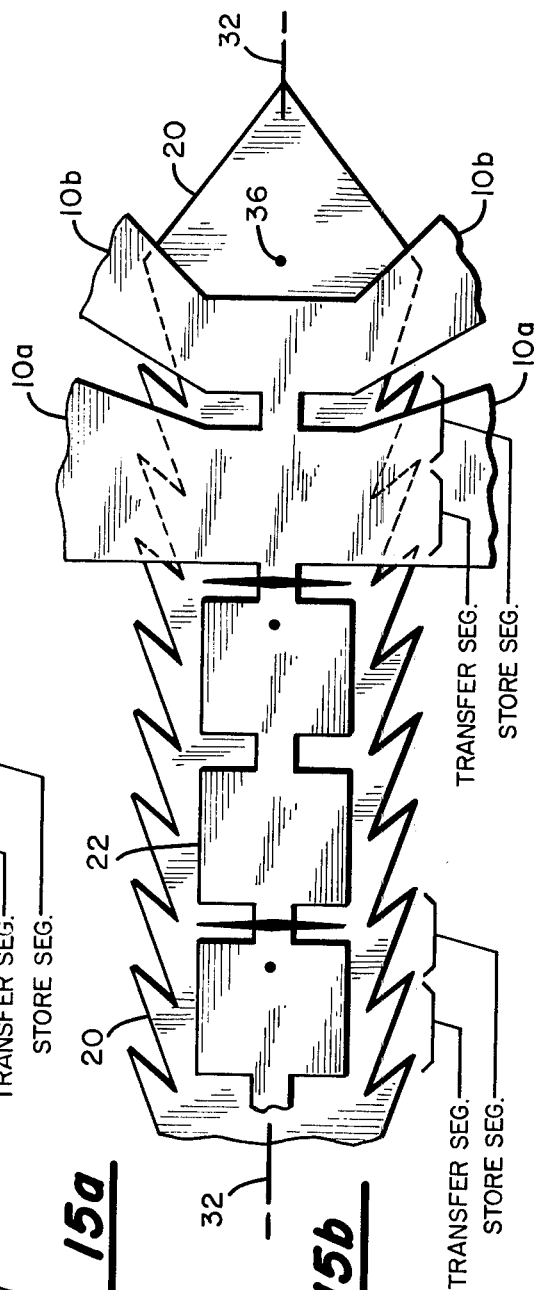
Fig. 15a
Fig. 15b

NONDESTRUCTIVE READOUT, RANDOM ACCESS CROSS-TIE WALL MEMORY SYSTEM

BACKGROUND OF THE INVENTION

The propagation of inverted Néel wall sections in a serial access memory system was proposed by L. J. Schwee in the publication "Proposal On Cross-tie Wall and Bloch-line Propagation In Thin Magnetic Films" IEEE Transactions on Magnetics, MAG 8, No. 3, pages 405–407, September 1972. Such a memory system utilizes a ferromagnetic film of approximately 81% Ni-19% Fe approximately 350 Angstroms (Å) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such a cross-tie wall memory system, information is entered at one end of the serial access memory system by the generation of an inverted Néel wall section, formed by a cross-tie on one side and a Bloch-line on the other, that is representative of a stored binary 1 or of a non-inverted Néel wall section (i.e., the absence of a cross-tie and Bloch-line pair) that is representative of a stored binary 0. Such information is moved or propagated along the cross-tie wall by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections at successive memory cells along the cross-tie wall. In the L. J. Schwee U.S. Pat. No. 3,868,660 and in the publication "Cross-tie Memory Simplified by the Use of Serrated Strips," L. J. Schwee, et al, AIP Conference Proceedings, No. 29, 21st Annual Conference on Magnetism and Magnetic Materials, 1975, published April 1976, pages 624–625, and in the publication "Cross-Tie/-Bloch-Line Detection," G. J. Cosimini, et al, AIP Conference Proceedings, No. 3, 23rd Annual Conference on Magnetism and Magnetic Materials, 1978, published March, 1978, pages 1828–1830, there have been published more recent results of the further development of cross-tie wall memory systems.

In prior art cross-tie wall memory systems, the magnetic film that functions as the storage medium has the property of uniaxial anisotropy provided by its easy axis induced magnetic fields, which easy axis is generated in the magnetic film during its formation in the vapor deposition process. This easy axis provides a magnetic field induced anisotropy which constrains the generation of the cross-tie wall along and parallel to the easy axis. In the above L. J. Schwee, et al, AIP publication there are proposed serrated strips of Permalloy film, about 350 Angstroms (Å) in thickness and 10 microns (μm) in width, which serrated strips are etched from a planar layer of the magnetic material so that the strips are aligned along the easy axis of the film. After an external magnetic field is applied normal to the strip length, i.e., transverse the easy axis of the film, the magnetization along the opposing serrated edges rotates back to the nearest direction that is parallel to the edge. This generates two large domains that are separated by a Néel or cross-tie wall that is formed along the centerline of the strip. Cross-ties are energetically more stable at the necks of the serrated edges while Bloch-lines are energetically more stable in the potential wells between adjacent necks.

This serrated strip configuration, because of the contour of the opposing edges of the strip, provides the means whereby the cross-tie, Bloch-line pairs are structured at predetermined memory sections along the strip. However, because prior art strips have field induced uniaxial anisotropy imparted during deposition, such strips cannot be utilized to permit the use of nonlinear, i.e., curved, data tracks, which curved data tracks are essential to the configuration of cross-tie wall memory systems of large capacity or of digital logic function capabilities. In the L. H. Johnson, et al, U.S. Pat. No. 4,075,612 there is disclosed a design of the edge contour of a film strip of, e.g., Permalloy film of approximately 350 Å in thickness and approximately 10 μm in width. The edge contours are mirror images, one of the other, of asymmetrical, repetitive patterns of rounded edge portions. The edge contour of each opposing pair of rounded edge portions is substantially in alignment with the natural contour of the magnetization that is oriented around a Bloch-line, which Bloch-line is positioned along the cross-tie wall that is oriented along the geometric centerline of the film strip. The neck or narrowest point of the edge contour between adjacent rounded edge portions functions to structure the static or rest position of the associated cross-tie of the cross-tie, Bloch-line pair.

In the M. C. Paul, et al, U.S. Pat. No. 4,130,888 there is disclosed a cross-tie wall memory system and in particular a data track therefore that is formed of a strip of magnetic material having substantially zero magnetic field induced anisotropy. The data-track-defining-strip of isotropic material utilizes its shape, i.e., its edge contour induced, anisotropy to constrain the cross-tie wall within the planar contour and along the centerline of the film strip. Accordingly, the cross-tie wall is constrained to follow the path defined by the magnetic film strip which path may be configured into a major loop, or circular data track, configuration for large capacity memory storage.

In the E. J. Torok U.S. Pat. Nos. 4,030,591 and 4,075,613 there is utilized the data-track-defining-strip of isotropic magnetic film of the hereinabove referenced M. C. Paul, et al, patent to form a replicator of and a logic gate for cross-tie, Bloch-line pairs. The replicator is utilized as a magnetic switch or gate to selectively transfer cross-tie, Bloch-line pairs between merging, overlapping data tracks. This permits the configuration of a plurality of continuous data tracks into a major-loop, minor-loop configuration for a large capacity memory system. The logic gate is utilized as a magnetic switch to selectively perform the logic OR function or the logic AND function upon two merging, overlapping data tracks.

The use of the major-loop, minor-loop configuration permits the information bearing cross-tie, Bloch-line pairs to be circulated past a detector in the major loop, which detector determines the presence or absence of the cross-tie, Bloch-line pairs as indicative of the storage of binary 1's or 0's. This readout is nondestructive because the stored information is generally continuously circulated around the minor loops, but is transferred, or replicated, into the major loop for readout. This, of course, generates a greater than desirable latency time such as is common to all non-random access memory devices such as charge-coupled-devices, magnetic drums, disks, etc. In the present invention this latency time is substantially reduced while still providing nondestructive readout of the stored data word.

SUMMARY OF THE INVENTION

In the cross-tie wall memory system of the present invention, there is provided a shift register having a cross-tie, Bloch-line pair generator at one end and a detector in the middle. The shift register consists of at least 2N memory cells spaced therealong, each memory cell consisting of a store section and a transfer section. The N cross-tie, Bloch-line pairs or bits of the to-be-stored N-bit data word are written or stored into the N memory cells of the shift register between the generator and the detector. For the readout of the stored data word, the N-bits are shifted through the detector into N memory cells (0 through N−1) with the (N−1)$^{th}$ bit being left resident in the detector. After readout, the N bits of the readout data word are restored into their original stored memory cells by being reverse shifted through the detector. Thus, the present invention provides for random-access, nondestructive readout of the stored data word.

BRIEF DESCRIPTION OF THE DRAWINGS

FIGS. 6a through 6h are schematic illustrations of the propagation of the cross-tie, Bloch-line pairs for a store-transfer cycle of the store operation as effected by the timing diagram of FIG. 5.

FIGS. 9a, 9b are schematic illustrations of the positions of the cross-tie, Bloch-line pairs of the N-bits of the stored data word after completion of the store operation.

FIGS. 11a, 11b are schematic illustrations of the positions of the cross-tie, Bloch-line pairs of the N-bits of the readout data word after completion of the readout operation.

FIGS. 13a, 13b are schematic illustrations of the positions of the cross-tie, Bloch-line pairs of the N-bits of the readout data word after completion of the Bloch-line transfer operation.

FIGS. 14a, 14b are schematic illustrations of the positions of the cross-tie, Bloch-line pairs of the N-bits of the restored data word after completion of the restore operation.

FIGS. 15a, 15b are schematic illustrations of the positions of the cross-tie, Bloch-line pairs of the N-bits of the restored data word after completion of the Bloch-line retransfer operation.

DESCRIPTION OF THE PREFERRED EMBODIMENT

Figure 1:
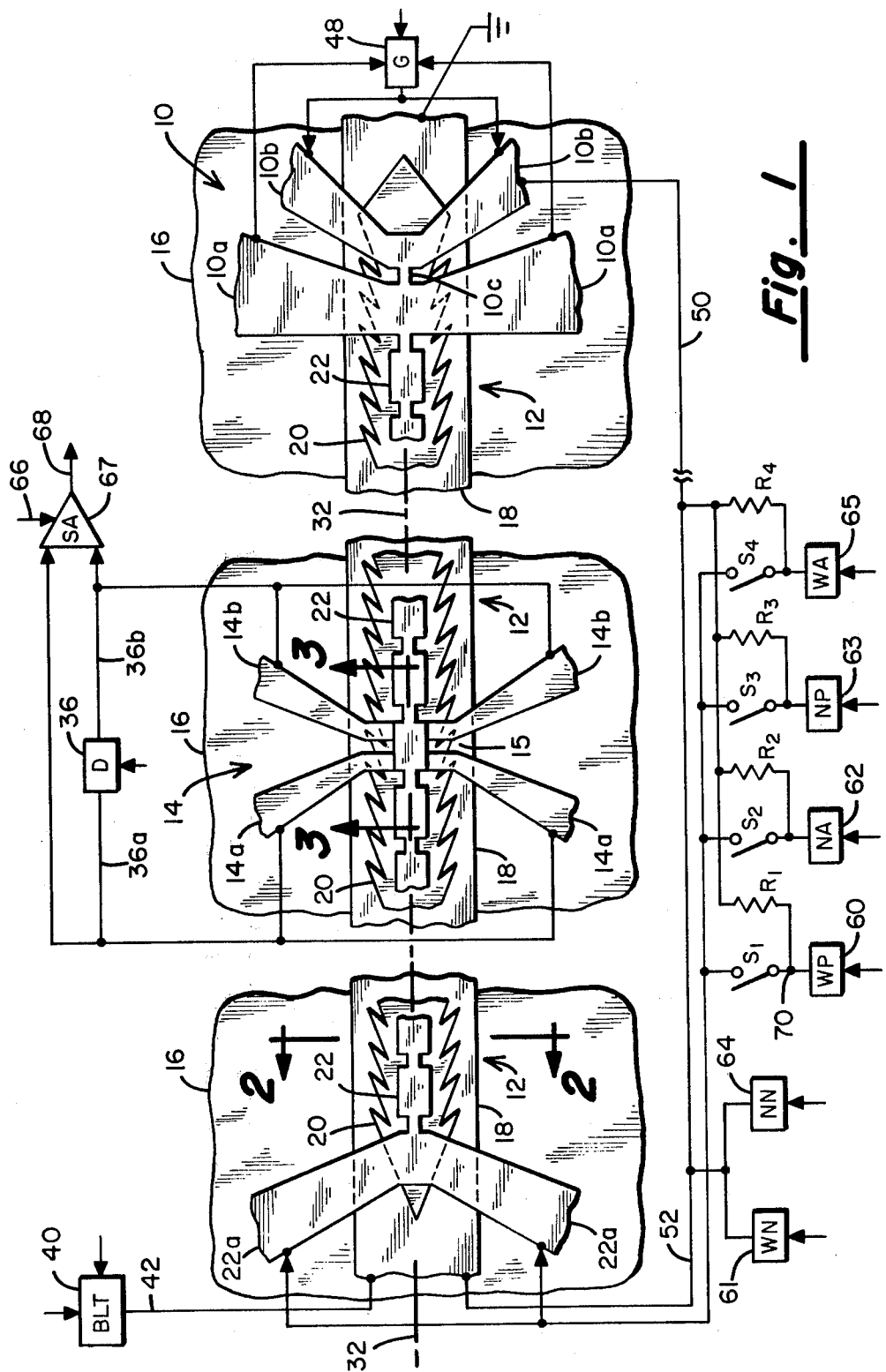
FIG. 1 is a schematic illustration of a portion of a cross-tie wall memory system incorporating the present invention.
Figure 2:
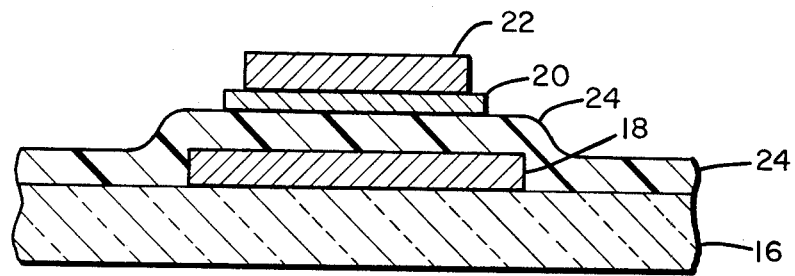
FIG. 2 is an illustration of a cross-section of the memory plane of FIG. 1 taken along line 2—2 thereof.

FIG. 1 is an illustration of a portion of a cross-tie wall memory system into which the generator 10, the shift register 12, and the detector 14 of the present invention have been incorporated. FIG. 2 is an illustration of a cross-section of the memory plane of FIG. 1 taken along line 2—2 thereof for the purpose of illustrating the stacked, superposed elements of FIG. 1. The memory system of FIG. 1 includes a non-magnetizable, e.g., glass or silicon, substrate member 16 having the following active members arranged in a stacked, superposed integral assembly: conductive, e.g., gold, straight-edged stripline 18; magnetizable, e.g., NiFe, serrated-edged data track 20; and conductive, e.g., gold, wide-narrow-edged stripline 22. Not illustrated in FIG. 1 or FIG. 2 are thin adhesive layers of, e.g., chromium, that may be affixed to the top and/or the bottom surfaces of the metallic layers for ensuring an integral assembly of the metallic layers with the adjacent metallic or insulating layers; illustrated in FIG. 2 is a thin, smoothing and insulating layer 24 of, e.g., SiO, between the current-conducting striplines 18 and 22. Still further, but not illustrated in either FIGS. 1 or 2, superposed this entire assembly and affixed to the top surface thereof, there may be provided an additional, e.g., SiO, sealing and insulating layer.

Figure 3:
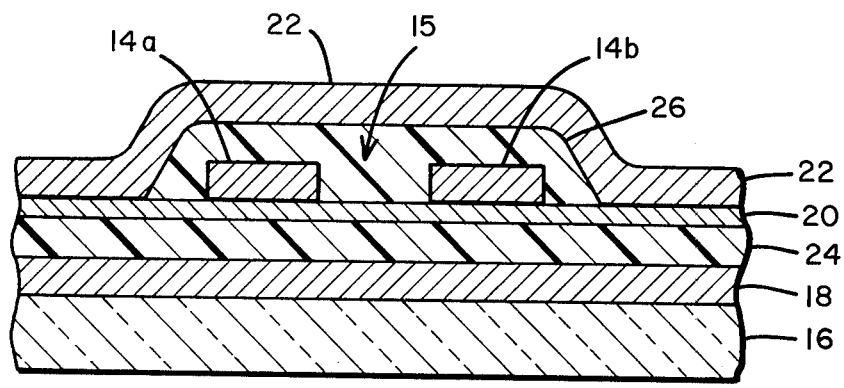
FIG. 3 is an illustration of a cross-section of the memory plane of FIG. 1 taken along line 3—3 thereof.

FIG. 3 is an illustration of a cross-section of the memory plane of FIG. 1 taken along line 3—3 thereof for the purpose of illustrating the stacked, superposed elements of FIG. 1 in the area of detector 14. The stacked relationship of the elements of FIG. 3 is similar to that of FIG. 2 except for the addition of the branches 14a, 14b of detector 14 that are electrically conductively affixed to serrated-edged data track 20 and the insulating layer 26 that electrically insulates wide-narrow-edged stripline 22 from detector 14 and straight-edged stripline 18.

With respect to substrate 16 and stripline 18, such configurations may be similar to that of the D. S. Lo, et al, U.S. Pat. No. 3,906,466. Additionally, with respect to data track 20, it may be configured in the manner as taught by the L. J. Schwee U.S. Pat. No. 3,868,660 and in the publication "Cross-tie Memories Simplified by the Use of Serrated Strips," L. J. Schwee, et al, AIP Conference Proceedings, No. 29, 21st Annual Conference on Magnetism and Magnetic Materials, 1975, published April, 1976, pages 624–625; or in the manner as taught by the L. H. Johnson, et al, U.S. Pat. No. 4,075,612. With respect to the particular configuration or embodiment of data track 20, it is preferably configured into a film strip whose two opposing edges are formed into mirror-imaged, repetitive patterns of successive narrow portions, transverse to centerline 32, that form wide portions therebetween between which the cross-tie, Bloch-line pairs are structured.

As is well known, such data track 20 when effected by the proper drive fields establishes a cross-tie wall along its geometric centerline which is substantially aligned with its longitudinal axis, identified as line 32 of FIG. 1. Preferably the film strip is isotropic, i.e., has substantially zero magnetic field induced anisotropy, and utilizes its shape, i.e., its edge contour, to constrain the cross-tie wall within the planar contour of and along the longitudinal axis 32. However, it is to be noted that data track 20 may be configured into a film strip whose two opposing edges are parallel, straight lines along which the positioning of the Bloch-line is structured solely by the configuration of a drive line as taught in the E. J. Torok U.S. Pat. No. 4,075,613.

However, in the present illustrated embodiment of FIG. 1, stripline 22 is configured into a widenarrow drive line comprised of an alternating series of wide-narrow portions, in which the wide portion is approximately three times the length of the narrow portions. The narrow portion of stripline 22 are substantially centered about the alternate, i.e., every other, narrow portion of data track 20 while the wide portions of stripline 22 are substantially centered about the other alternate narrow portions of data track 20. For purposes of the present invention, the narrow portions of data track 20 and the associated narrow portions of stripline 22 are defined as a store segment, while the narrow portions of data track 20 and the associated wide portions of stripline 22 are defined as a transfer segment—see the D. S. Lo, et al, U.S. Pat. No. 3,906,466—both combining to comprise a memory cell, a plurality of which are aligned along the data track 20, stripline 22 of FIG. 1. Thus, the generator 10 of FIG. 1 is centered about a store segment while the detector 14 is centered about a transfer segment. This will be further explained in the discussion of the operation of FIG. 1 as illustrated in FIGS. 6a through 6h and the timing diagram of FIG. 5.

With particular reference to FIG. 3, there is presented a cross-sectional view of the superposed stripline 18, data track 20, detector 14, and stripline 22 of FIG. 1 taken along line 3—3 thereof for the purpose of illustrating the configuration of the stacked, superposed active elements thereof. FIG. 3 illustrates that this stacked, superposed relationship includes the following listed successive layers, with the adhesive and sealing layers not illustrated for clarity:

glass substrate 16—0.50 mm thick
chromium adhesive layer—100 Å thick
gold stripline 18—1500 Å thick
chromium adhesive layer—100 Å thick
SiO insulative layer 24—12,500 Å thick
Permalloy data track 20—approximately 81% Ni-19% Fe, 350 Å thick
chromium adhesive layer—100 Å thick
gold detector arms 14a, 14b—1000 Å thick
chromium adhesive layer—100 Å thick
SiO insulative layer 26—12,500 Å thick
chromium adhesive layer—100 Å thick
gold stripline 22—1000 Å thick
SiO sealing layer—12,500 Å thick.

With reference back to FIG. 1, there is illustrated a shift register 12, comprised of straight-edged stripline 18, serrated-edged data track 20 and wide-narrow stripline 22. Shift register 12 is terminated at one end by generator 10, comprised of an end portion of data track 20 and a terminating portion of stripline 22 having conductive elements 10a, 10b extending from adjacent wide portions thereof separated by a narrow portion 10c in which the cross-tie of the cross-tie, Bloch-line pair is generated. Shift register 12 is terminated on the other end by wide portions 22a. Intermediate the two ends of shift register 12 is detector 14, which consists of a superposed portion of data track 20 and a superposed wide portion of wide-narrow stripline 22 that sandwich conductive elements 14a, 14b, which extend transversely from the superposed wide portion of stripline 22, therebetween. Elements 14a and 14b are separated to form a gap 15 of detector 14, across which separation or gap 15 the presence or absence of the cross-tie is detected magneto-resistively—see FIG. 3.

In this illustrated embodiment, wide-narrow stripline 22, and its integral elements 10a, 10b, 10c, and 22a are formed during the same, e.g., vacuum deposition step of the same material and of the same thickness. This method of forming the generator and the wide-narrow propagate drive line in one layer during the same process step greatly simplifies the fabrication of a complete cross-tie wall memory system. Additionally, the memory plane of the cross-tie wall memory system of FIG. 1 is symmetrical about its longitudinal axis or centerline 32 whereby current paths are symmetrical providing symmetry of the so-generated drive fields.

With particular reference to FIG. 5 and FIGS. 6a through 6h, there are presented illustrations of a timing diagram and the resultant generation, propagation and detection of cross-tie, Bloch-line pairs in the cross-tie wall memory system of FIG. 1. This process is substantially similar to that of the copending patent application of G. J. Cosimini, et al, Ser. No. 20,762, filed Feb. 23, 1979.

Figure 4:
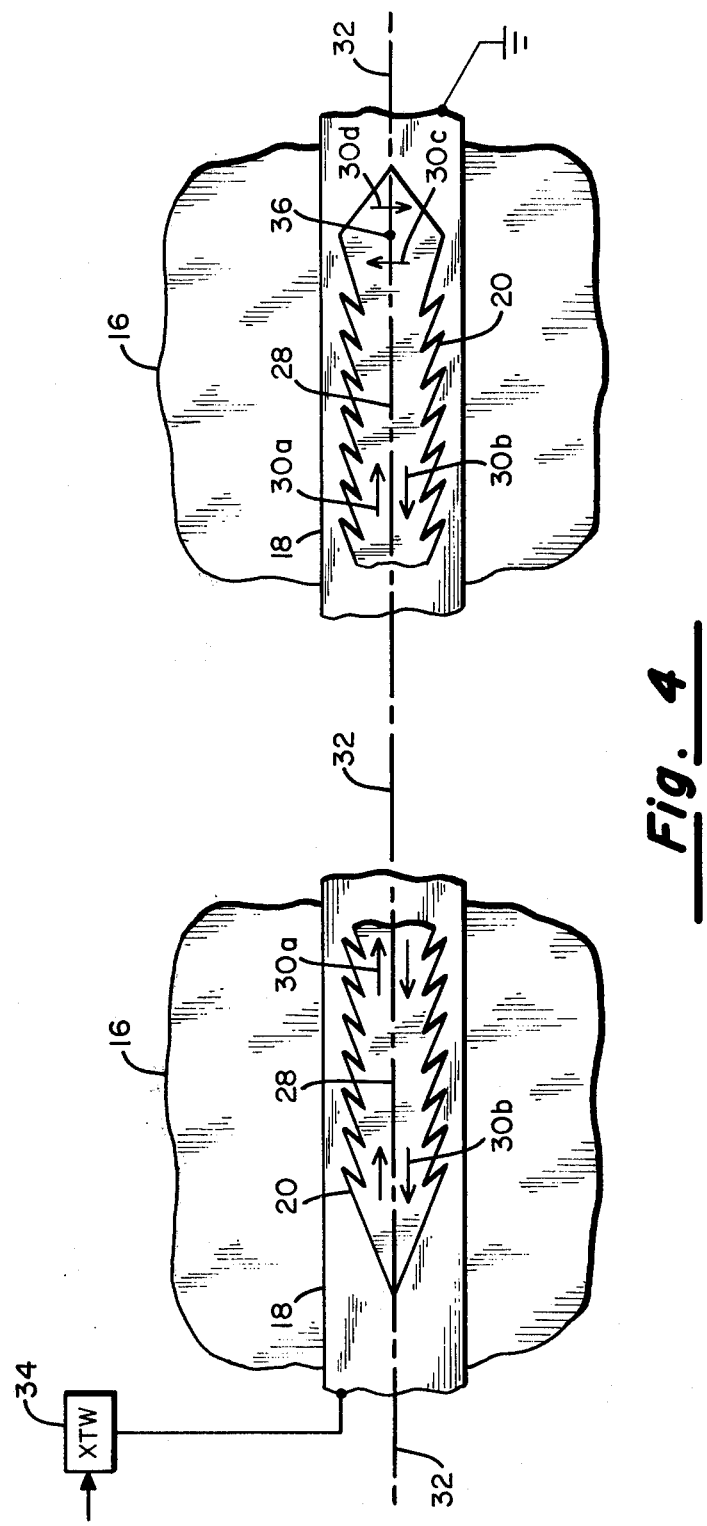
FIG. 4 is a schematic illustration of the data track of FIG. 1 illustrating the positioning of the cross-tie wall and the associated Bloch-line as initially generated in the data track by an appropriate current signal coupled to the straight-edged stripline.

The propagation of the cross-tie, Bloch-line pairs along data track 20 under the influence of the drive fields provided by the coupling of the proper current drive signals to stripline 18 and stripline 22 is in the well-known manner. This requires a store-transfer sequence of the propagation of the cross-tie and the Bloch-line within a memory cell—see the D. S. Lo, et al, U.S. Pat. No. 3,906,466. In this method of propagation, the cross-tie wall 28 is initially formed along the geometric centerline 32 of the data track 20 by an in-plane field normal to the longitudinal axis of the data track, as by a current signal coupled to stripline 18 by current source 34—see FIG. 4. The serrated edges of the data track 20, when the in-plane field is removed, cause the magnetization M within data track 20 to collapse forming two anti-parallel magnetic domains on opposite sides of cross-tie wall 28 as represented by arrows 30a, 30b. The shape of the right-hand end of data track 20, in the area of generator 10, causes a Bloch-line 36 to be formed therein having the clockwise magnetization orientation thereabout as represented by arrows 30c, 30d. The use of Bloch-line 36 in the present invention will be discussed later in greater detail.

The combination of the pattern of the serrated edges of data track 20 and the design of the propagate drive line, or the wide-narrow edge pattern of stripline 22, establishes or structures the memory cells along the data track. To propagate the cross-tie, Bloch-line pairs in the well-known manner, each memory cell is required to include a store segment and a transfer segment, the order or names of which are purely arbitrary. These two segments are required due to the mechanism whereby cross-tie, Bloch-line pairs are propagated along a data track.

Initially, a cross-tie, Bloch-line pair is established in a first store segment defined by the length of one serrated edge along the data track in which the cross-tie is oriented between the narrow width or portion of the data track, and the associated Bloch-line is oriented between the two adjacent narrow portions and on the downstream side of the associated cross-tie. Next, a drive field separates the Bloch-line from the associated cross-tie, "pushing" the Bloch-line downstream into the adjacent transfer segment leaving the associated cross-tie in its initial position. Next, a nucleate drive field generates a cross-tie, Bloch-line pair between the separated cross-tie and Bloch-line. Next, an annihilate drive field annihilates the cross-tie, Bloch-line pair that is resident in the store segment effectively transferring the initial cross-tie, Bloch-line pair from the store segment into the downstream transfer segment. This sequence is repeated so that after two consecutive push-nucleate-annihilate cycles the cross-tie, Bloch-line pair has been propagated from a store segment, through a transfer segment of the same memory cell and into the store segment of the next adjacent downstream memory cell.

Thus, in the illustrated embodiment, the center of the narrow portion of wide-narrow-edged stripline 22 and the corresponding narrow portion of serrated-edged data track 20 define a store segment while the downstream center of the wide portion of wide-narrow-edged stripline 22 and the corresponding narrow portion of serrated-edged data track 20 define the transfer segment. Thus, each consecutive downstream narrow-wide segment of stripline 22 defines a memory cell comprised of a store segment and a downstream transfer segment.

Figure 5:
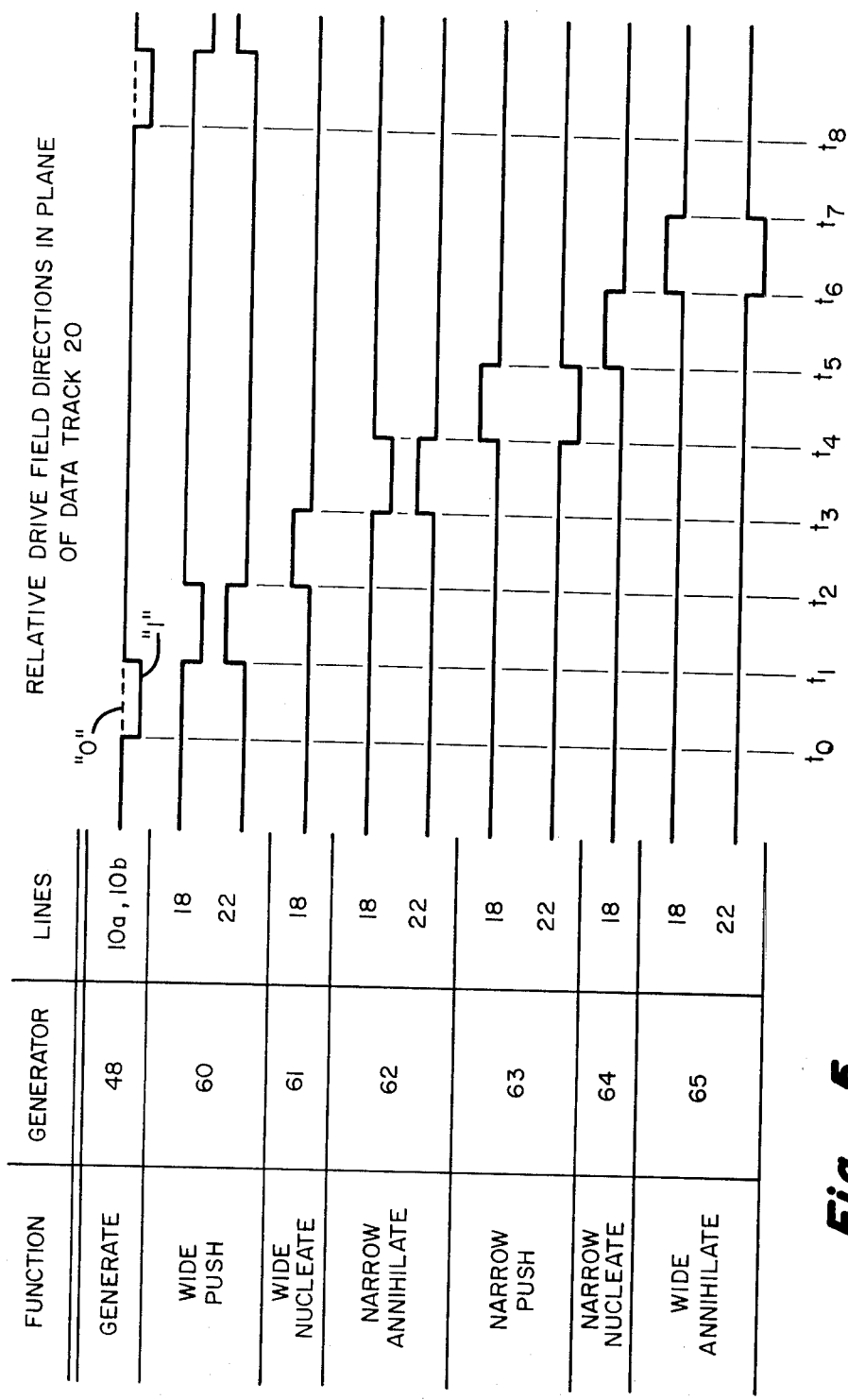
FIG. 5 is an illustration of an illustrative timing diagram for the store operation of the system of FIG. 1.

With respect to the timing diagram of FIG. 5, assume that prior to time $t_0$ the generator 10 of FIG. 1 is empty having no cross-tie, Bloch-line pair established therein. This is as indicated in FIG. 6a. Now, at a time $t_0$, generator 48 couples a Generate current signal to generator 10, via conductive elements 10b, 10c, 10a, generating a cross-tie, Bloch-line pair in generator 10. This is as illustrated in FIG. 6b. Note that generator 48 selectively couples the Generate current signal to generator 10 for the generation vel non of a cross-tie, Bloch-line pair within generator 10. In the timing diagram of FIG. 5 the generation of the cross-tie, Bloch-line pair is indicative of the significant amplitude signal representative of the storage of a "1" in the cross-tie wall memory system of FIG. 1 while the insignificant signal is indicative of the storage of a "0" in the cross-tie wall memory system of FIG. 1.

Next, at time $t_1$ with the Generate current signal terminated, generator 60, via closed normally-open switch $S_1$, couples a positive polarity Wide Push current signal to stripline 22 via conductive element 22a. Wide Push current signal flows down stripline 22 from left to right, through lines 50, 52, through stripline 18 from left to right and thence to ground. This Wide Push current signal "pushes" the Bloch-line in the store segment of the memory cell in generator 10 into the next adjacent downstream transfer segment thereof—this is as illustrated in FIG. 6c.

Figures 7, 8:
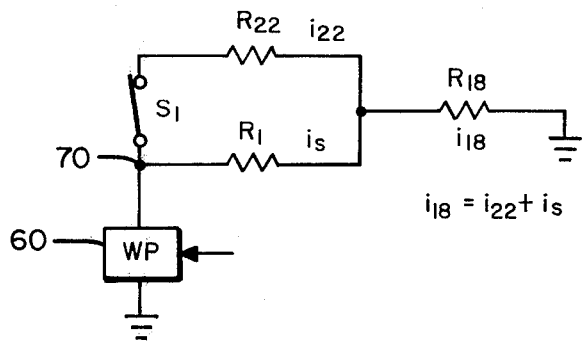
FIG. 7 is a typical diagrammatic circuit schematic for the push and annihilate current signals of FIG. 5.
FIG. 8 is a table of illustrative current signal durations and magnitudes for the timing diagram of FIG. 5.

With particular reference to FIG. 7, there is presented a diagrammatic circuit schematic of the equivalent circuit for the push-annihilate current generators 60, 62, 63, 65 of FIG. 1. When Wide Push current generator 60 couples the Wide Push current signal to the common point or node 70, with normally-open switch $S_1$ closed, the Wide Push current signal is coupled to the parallel combination of the resistance $R_{22}$ of stripline 22 and shunt resistance $R_S$ of resistor $R_1$ and the serially coupled resistance $R_{18}$ of stripline 18. Shunt resistor $R_S$ is, for the four operations of FIG. 5: Wide Push at time $t_1$; Narrow Annihilate at time $t_3$; Narrow Push at time $t_4$; and Wide Annihilate at time $t_6$, selected to be of the desired magnitude to provide the desired relative current magnitude of $i_{22}$ and $i_{18}$ to flow down striplines 22 and 18, respectively. When such operations are discussed herein, the shunting effect of shunt resistors $R_1$, $R_2$, $R_3$ and $R_4$ shall not be discussed in detail, it being understood that the magnitude of the, e.g., Wide Push current signal in striplines 18 and 22 are not necessarily the same because of the use of the shunt resistors. Additionally, it is to be understood that because striplines 18 and 22 are on opposite sides of data track 20, current signals of the same polarity flowing in the same direction generate drive fields in the plane of data track 20 that are of the opposite polarity as indicated in FIG. 3. Lastly, the current signals shall be discussed as following from, e.g., left to right along stripline 22 even though the polarities of the different signals, e.g., Wide Push current signal from generator 60 and Narrow Push current signal from generator 63, may be opposite.

Next, at time $t_2$, with the Wide Push current signal terminated, generator 61, via line 52, couples a negative polarity Wide Nucleate current signal to stripline 18. Wide Nucleate current signal flows down stripline 18 left to right to ground. This Wide Nucleate current signal generates a new cross-tie, Bloch-line pair between the separated cross-tie, Bloch-line pair previously separated at time $t_1$—this is as illustrated in FIG. 6d.

Figures 6E, 6F:
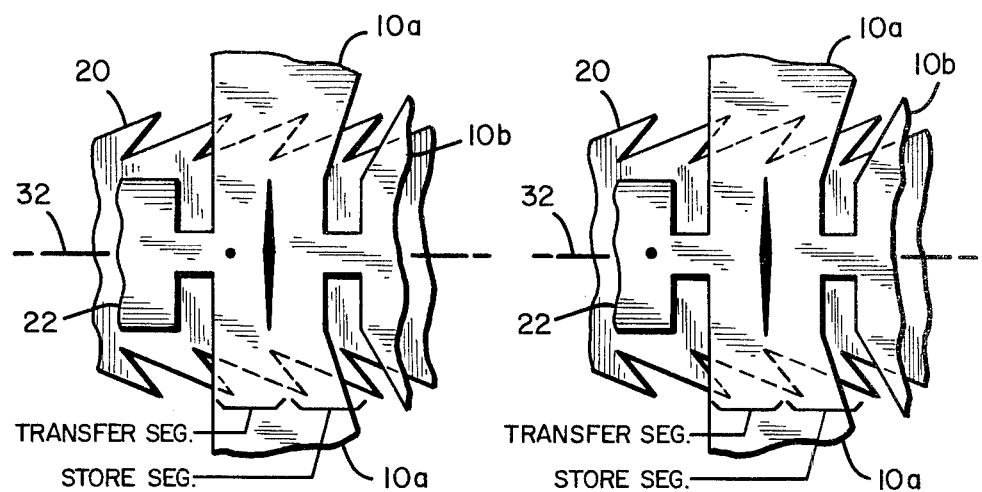

Next, at time $t_3$, with the Wide Nucleate current signal terminated, generator 62, via closed normally-open switch $S_2$, couples a Narrow Annihilate current signal to stripline 22 via conductive element 22a. Narrow Annihilate current signal flows down stripline 22 from left to right through lines 50, 52 through stripline 18 from left to right and thence to ground. This Narrow Annihilate current signal annihilates the cross-tie, Bloch-line pair resident in the store segment of the memory cell in generator 10—this is as illustrated in FIG. 6e. The cross-tie, Bloch-line pair generated in generator 10 in the store segment of the memory cell in generator 10 has now been propagated downstream into the associated transfer segment.

Next, at time $t_4$, with the Narrow Annihilate signal from generator 62 terminated, generator 63, via closed normally-open switch $S_3$, couples a negative polarity Narrow Push current signal to stripline 22 via conductive element 22a. Narrow Push current signal flows down stripline 22 from left to right, through lines 50, 52, through stripline 18 from left to right and thence to ground. This Narrow Push current signal "pushes" the Bloch-line in the transfer segment of the memory cell in generator 10 into the store segment of the next downstream memory cell—this is as illustrated in FIG. 6f.

Figures 6G, 6H:
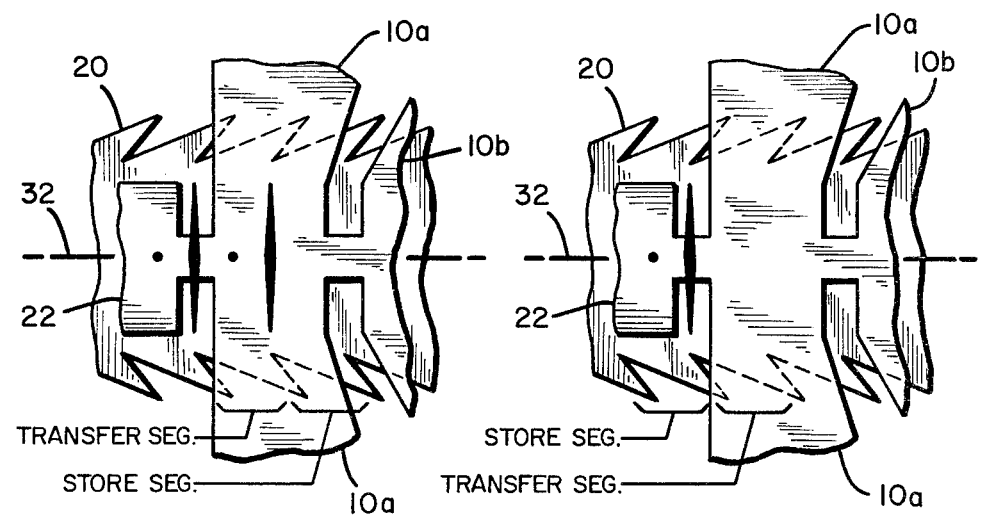

Next, at time $t_5$, with the Narrow Push current signal terminated, generator 64, via line 52, couples a negative polarity Narrow Nucleate current signal to stripline 18. Narrow Nucleate current signal flows down stripline 18 left to right to ground. This Narrow Nucleate current signal generates a new cross-tie, Bloch-line pair between the separated cross-tie, Bloch-line pair previously separated at time $t_4$. This is as illustrated in FIG. 6g.

Next, at time $t_6$, with the Narrow Nucleate current signal terminated, generator 65, via closed normally-open switch $S_4$, couples a negative polarity Wide Annihilate current signal to stripline 22 via conductive element 22a. Wide Annihilate current signal flows down stripline 22 from left to right, through lines 50, 52, through stripline 18 from left to right and thence to ground. This Wide Annihilate current signal annihilates the cross-tie, Bloch-line pair presently resident in the transfer segment of the memory cell in generator 10 leaving the now-propagated cross-tie, Bloch-line pair resident in the store segment of the next downstream memory cell from generator 10—this is as illustrated in FIG. 6h.

This push/nucleate/annihilate sequence continues for N store cycles or operations propagating downstream the cross-tie, Bloch-line pairs, as generated by generator 10, through shift register 12 and toward detector 14. FIG. 8 is a table of illustrative current signal durations and magnitudes for the timing diagram of FIG. 5 using Bitter powder technique for observation.

Assuming an N-bit data word, of the following bit conformation, has been stored in shift register 12 after completion of the store operation,

| LSB | | | | | | | | MSB |
|-----|---|---|---|---|---|-----|-----|-----|
| 0   | 1 | 2 | 3 | — | — | N-4 | N-3 | N-2 | N-1 |
| 0   | 1 | 1 | 0 | — | — | 1   | 0   | 1   | 0 |

FIGS. 9a, 9b are schematic illustrations of the positions of the cross-tie, Bloch-line pair-representing-bits of the stored N-bit data word after N store cycles or operations as illustrated in FIG. 5 and FIGS. 6a through 6h and as discussed above.

Figure 10:
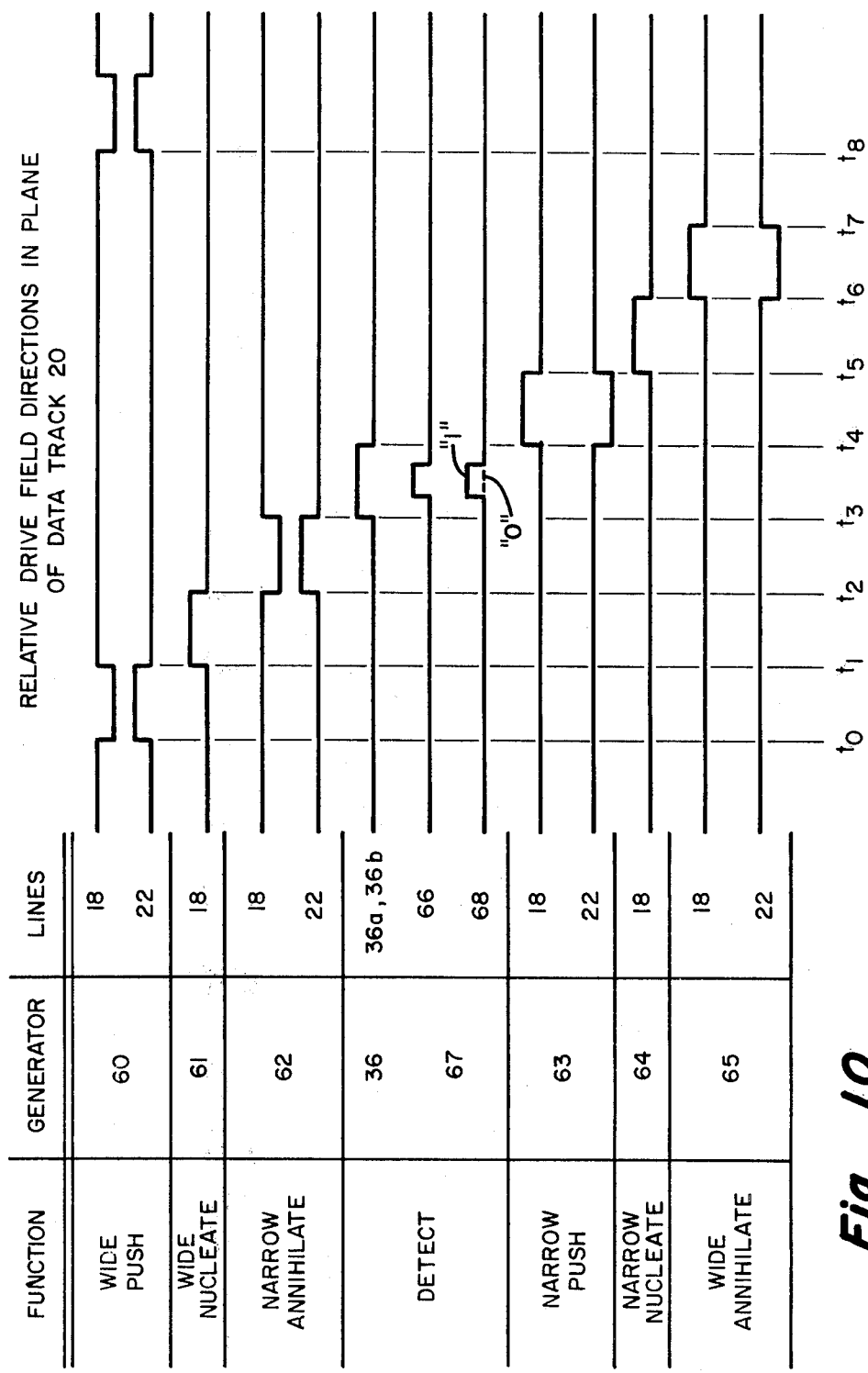
FIG. 10 is an illustration of an illustrative timing diagram for the readout operation of the system of FIG. 1.

Now, after completion of the N store operations, the readout operation may be initiated. The readout operation is substantially similar to the store operation except that a detect operation is performed intermediate the termination of the Narrow Annihilate current signal and the start of the Narrow Push current signal. FIG. 10 is an illustration of an illustrative timing diagram for the readout operation, and is similar to that of FIG. 5 except for the deletion of the Generate current signal and the addition of the Detect current signal.

For the readout operation the N-bits of the stored data word are bit-serially shifted through detector 14 in the same manner as discussed above with respect to FIG. 5 and FIGS. 6a through 6h except that no new data is stored in shift register 12 by generator 10 because the Generate current signal is not utilized. However, after each Narrow Annihilate current signal and before each Narrow Push current signal, generator 36 couples a Read current signal across conductive elements 14a and 14b of detector 14. The resulting readout signal on line 68, as detected by sense amplifier 67 and as gated by the Gate Detect signal on line 66, is a function of the magneto-resistive effect of the presence or absence of a cross-tie in the transfer segment of the memory cell in gap 15 of detector 14. Each cross-tie in gap 15 during each of the N successive readout operations will provide a significant output signal on line 68, indicative of the readout of a stored "1," while conversely the absence of a cross-tie in gap 15 during each of the N successive readout operations will provide an insignificant output signal on line 68, indicative of the readout of a stored "0." After completion of the N readout operations the positions of the cross-tie, Bloch-line pair-representing-bits of the readout N-bit data word are as schematically illustrated in FIGS. 11a, 11b.

Figure 12:
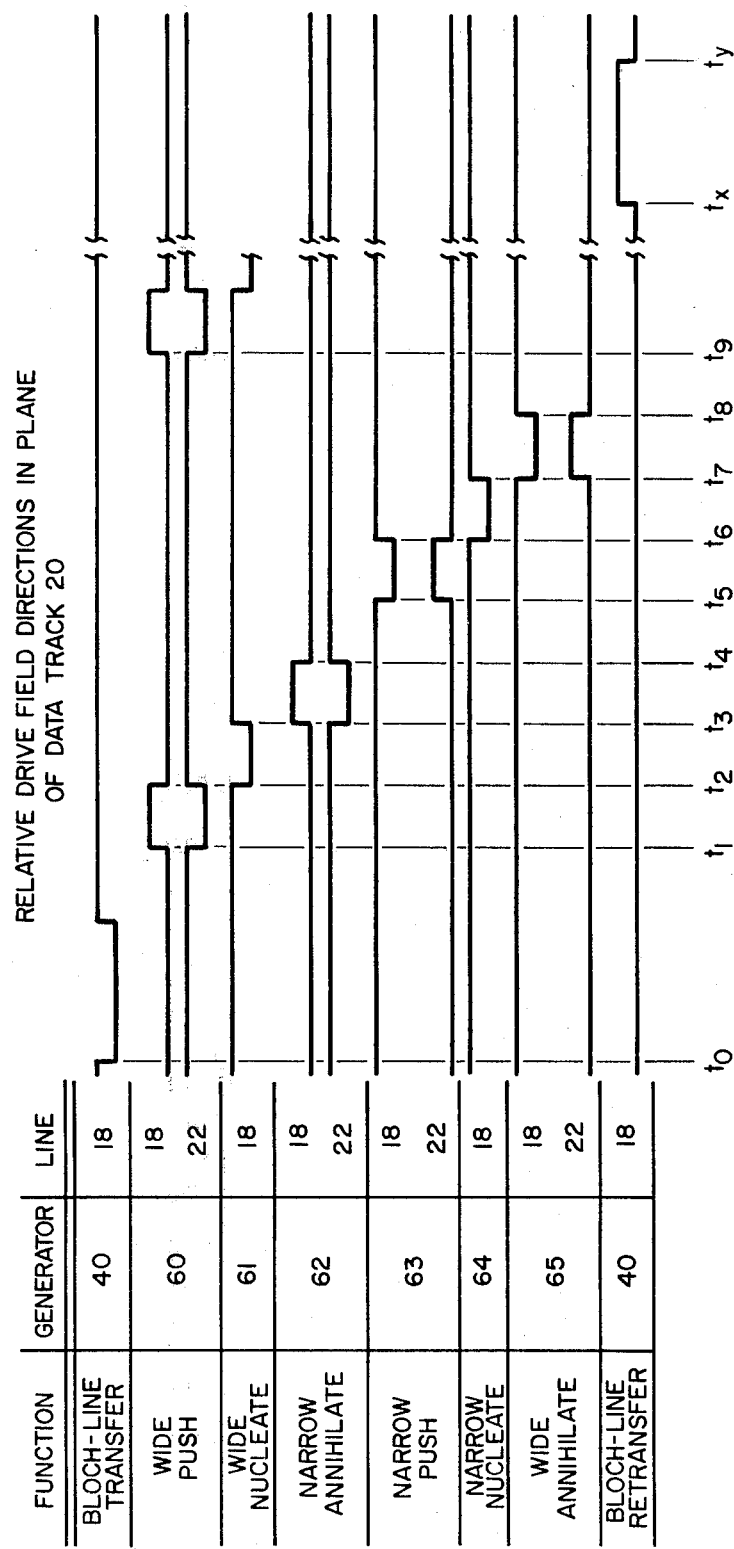
FIG. 12 is an illustration of an illustrative timing diagram for the restore operation of the system of FIG. 1.

Now after completion of the N readout operations, the restore operation may be initiated. The restore operation is substantially similar to the store operation except that the current signal polarities are reversed and a Bloch-line transfer current signal precedes the restore operation and a Bloch-line Retransfer current signal follows the N restore operations. FIG. 12 is an illustration of an illustrative timing diagram for the restore operation.

The initial phase of the restore operation, prior to the initiation of N restore operations, is a Bloch-line transfer operation which transfers each upstream Bloch-line of each cross-tie, Bloch-line pair to the upstream side of the next adjacent downstream cross-tie. This operation is essential as it is to be remembered that for the propagation of a cross-tie, Bloch-line pair during the store and readout operations: the Bloch-line of each cross-tie, Bloch-line pair is first pushed downstream away from the associated cross-tie; next a new cross-tie, Bloch-line pair is generated between the separated cross-tie, Bloch-line pair; and then the upstream cross-tie, Bloch-line pair are annihilated. Thus, it is essential that the Bloch-line of each cross-tie, Bloch-line pair is positioned on the upstream—the direction that the cross-tie, Bloch-line pair are to be propagated—side of the associated cross-tie.

At a time $t_0$ current signal generator 40 couples a Bloch-line Transfer current signal to stripline 18 via line 42. The Bloch-line Transfer current signal is similar to a Push current signal of the store operation but of sufficient duration to "push" all the Bloch-lines of the cross-tie, Bloch-line pairs of the readout data word downstream—to the left—to the upstream side of the next adjacent downstream cross-tie. The Bloch-line 36 that was established in cross-tie wall 28 at the right-hand end of data track 20 at the time the cross-tie wall 28 was established—see FIG. 4—is at this time propagated from its position at the right-hand end of data track 20 in the vicinity of generator 10 to the left to the upstream side of the first cross-tie, Bloch-line pair past detector 14. Also as this time Bloch-line 38 of the first cross-tie, Bloch-line pair of the readout data word, i.e., the leftmost Bloch-line, is pushed or transferred into the left-hand end of data track 20. FIGS. 13a, 13b are schematic illustrations of the positions of the cross-tie, Bloch-line pairs of the N-bits of the readout data word after termination of the Bloch-line Transfer current signal.

Now after completion of the Bloch-line transfer operation, the N restore operations may be initiated. The restore operation is, as discussed above, substantially similar to the store operation except for a reversal of current signal polarities because of the reversal of direction of propagation of the cross-tie, Bloch-line pairs.

For the restore operation the N-bits of the readout data word are bit-serially shifted through detector 14 in a manner similar to that discussed above with respect to FIG. 5 and FIGS. 6a through 6h but in an opposite direction, from left to right into the original stored data word bit positions but with the Bloch-line on the right-hand side of the associated cross-tie. After completion of the N restore operations the positions of the cross-tie, Bloch-line pair-representing-bits of the restored data word are schematically illustrated in FIGS. 14a, 14b.

Now after completion of the N restore operations the last phase of the restore operation, the Bloch-line retransfer operation, may be initiated. The Bloch-line retransfer operation transfers each upstream Bloch-line of each cross-tie, Bloch-line pair of the restored data word back to the upstream side of the next adjacent downstream cross-tie. This operation establishes the Bloch-lines, including Bloch-lines 36, 38, into their original positions after completion of the N store operations.

At a time $t_x$, after completion of the N restore operations, current signal source 40 couples a Bloch-line Retransfer current signal to stripline 18 via line 42. The Bloch-line Retransfer current signal is similar to the Bloch-line Transfer current signal but of opposite polarity and of sufficient duration to "push" all the Bloch-lines of the cross-tie, Bloch-line pairs of the restored data word upstream—to the right—to the upstream side of the next adjacent upstream cross-tie. The right-most Bloch-line 36 is at this time retransferred back into its initial position at the right-hand end of data track 20 in the vicinity of generator 10 while the left-most Bloch-line 38 is at this time retransferred back into its original position at the downstream—at the left-side of the left-most cross-tie of the restored data word.

At this time the readout operation may again be initiated as described above.

Thus, the present specification discloses a method of and an apparatus for providing a novel nondestructive readout of a random access, non-volatile memory system.

What is claimed is:

1. The method of bidirectionally propagating a cross-tie, Bloch-line pair along a cross-tie wall in a magnetizable medium, comprising:
   positioning a cross-tie and an adjacent downstream Bloch-line in a first position along said cross-tie wall for forming a cross-tie, Bloch-line pair;
   propagating said cross-tie and downstream Bloch-line pair in a downstream direction along said cross-tie wall into a second position;
   transferring a Bloch-line along said cross-tie wall to a position adjacent said cross-tie and upstream thereof;
   propagating said cross-tie and upstream Bloch-line pair in an upstream direction, opposite to said downstream direction, along said cross-tie wall back into said first position; and,
   retransferring the downstream Bloch-line of said cross-tie, Bloch-line pair back to its downstream position adjacent said cross-tie for reforming said cross-tie, Bloch-line pair in said first position.

2. In a cross-tie wall memory system in which cross-tie, Bloch-line pairs are propagated along a cross-tie wall in a magnetizable medium, the method of bidirectionally propagating said cross-tie, Bloch-line pairs along said cross-tie wall, comprising:
   positioning a first plurality of cross-tie, Bloch-line pairs along said cross-tie wall in a first position, with the associated Bloch-line of each cross-tie, Bloch-line pair positioned in a first direction along said cross-tie wall from the associated cross-tie;
   transferring the Bloch-lines of said first plurality of cross-tie, Bloch-line pairs from their associated cross-ties to their next-adjacent, first-direction, cross-ties for forming a plurality of new cross-tie, Bloch-line pairs;
   propagating said plurality of new cross-tie, Bloch-line pairs in a second direction, opposite to said first direction, along said cross-tie wall into a second position; and,
   retransferring the Bloch-lines of said plurality of propagated, new cross-tie, Bloch-line pairs from their associated cross-ties to their next adjacent second-direction cross-ties for reforming said first plurality of cross-tie, Bloch-line pairs in said second position.

3. In a cross-tie wall memory system in which cross-tie, Bloch-line pairs are propagated along a cross-tie wall in a magnetizable medium, the method of bidirectionally propagating said cross-tie, Bloch-line pairs along said cross-tie wall, comprising:
   positioning a first plurality of cross-tie, Bloch-line pairs along said cross-tie wall in a stored position, with the associated Bloch-line of each cross-tie, Bloch-line pair positioned in a first direction along said cross-tie wall from the associated cross-tie;
   propagating said first plurality of cross-tie, Bloch-line pairs in said first direction along said cross-tie wall past a detector means into a readout position for detecting the presence of said cross-tie, Bloch-line pairs;
   transferring the Bloch-lines of said first plurality of cross-tie, Bloch-line pairs from their associated cross-ties to their next-adjacent, first-direction, cross-ties for forming a plurality of new cross-tie, Bloch-line pairs;
   propagating said plurality of new cross-tie, Bloch-line pairs in a second direction, opposite to said first direction, along said cross-tie wall past said detector means and back into said stored position; and
   retransferring the Bloch-lines of said plurality of propagated, new cross-tie, Bloch-line pairs from their associated cross-ties to their next adjacent second-direction cross-ties for reforming said first plurality of cross-tie, Bloch-line pairs in said stored position.

4. A cross-tie wall memory system, comprising:
   detector means;
   shift register means of at least 2N memory cells in length, said detector means coupled to said shift register means for forming a stored position of at least N memory cells along said shift register means on the upstream side of said detector means and a readout position of at least N memory cells along said shift register means downstream of said stored position;
   generator means for generating an N-bit data word in said stored position, the bits of said data word represented by the presence or absence of cross-tie, Bloch-line pairs;
   readout means propagating the n-bits of said stored data word along said shift register means in said downstream direction past said detector means into a readout position for reading out the N-bits of said data word;
   transfer means for transferring the Bloch-line of each cross-tie, Bloch-line pair of said readout data word to the next adjacent downstream cross-tie;
   restore means propagating the N-bits of said readout data word along said shift register means in an upstream direction, opposite to said downstream direction, for restoring said readout data word back into its stored position; and,
   retransfer means for retransferring the Bloch-line of each cross-tie, Bloch-line pair of said restored data word to the next adjacent downstream cross-tie.

* * * * *

UNITED STATES PATENT AND TRADEMARK OFFICE
CERTIFICATE OF CORRECTION

PATENT NO. : 4,253,160
DATED : 2/24/81
INVENTOR(S) : Maynard C. Paul, Stanley J. Lins, David S. Lo It is certified that error appears in the above-identified patent and that said Letters Patent are hereby corrected as shown below:

Claim 3

Column 12, line 27
 "retransferring" should be new paragraph

Claim 4

Column 12, line 47
 "n" should be -- N --.

Signed and Sealed this

Twenty-ninth Day of September 1981

[SEAL]

Attest:

Attesting Officer

GERALD J. MOSSINGHOFF

Commissioner of Patents and Trademarks